United States Patent [19]

Garcia et al.

[11] Patent Number: 4,950,977

[45] Date of Patent: Aug. 21, 1990

[54] METHOD OF MEASURING MOBILE ION CONCENTRATION IN SEMICONDUCTOR DEVICES

[75] Inventors: Agustin M. Garcia; Cris W. Lawrence, both of Allentown; Morgan J. Thoma, Macungie, all of Pa.

[73] Assignee: AT&T Bell Laboratories, Murray Hill, N.J.

[21] Appl. No.: 287,776

[22] Filed: Dec. 21, 1988

[51] Int. Cl.$^5$ ............................................. H01L 21/00
[52] U.S. Cl. ....................................... 324/71.1; 437/8
[58] Field of Search ................. 324/71.1, 158 D, 71.5; 204/1 T; 437/8, 243; 29/569.1, 593

[56] References Cited

U.S. PATENT DOCUMENTS

| 3,290,179 | 12/1966 | Goulding | 324/158 D |
| 3,625,749 | 12/1971 | Takayanagi et al. | 437/243 |
| 3,887,726 | 6/1975 | Bratter et al. | 437/243 |
| 4,509,012 | 4/1985 | Lin | 324/158 D |

OTHER PUBLICATIONS

N. J. Chou, "Application of Triangular Voltage Sweep Method to Mobile Charge Studies in MOS Structures", J. Electrochem. Soc.: Solid State Science, Apr. 1971, vol. 118, No. 4, pp. 601–609.

M. Kuhn and D. J. Silversmith, "Ionic Contamination and Transport of Mobile Ions in MOS Structures", J. Electrochem. Soc.: Solid State Science, Jun. 1971, vol. 118, No. 6, pp. 966–970.

H. M. Przewlocki and W. Marciniak: Mobile Charge in MOS Structures, "The Triangular Voltage Sweep Method as a Tool in Studies of Mobile Charge in MOS Structures", phys. stat. sol. (a) 29.265 (1975), pp. 265–274.

Primary Examiner—Reinhard J. Eisenzopf
Assistant Examiner—Maura K. Regan
Attorney, Agent, or Firm—John T. Rehberg

[57] ABSTRACT

Mobile ion concentrations are measured in thick and disordered oxides by heating to a temperature greater than about 250° C.; using a triangular voltage sweep-like method with applied voltages substantially greater than normally used heretofore; and observing peak displacement currents at voltages, e.g., greater than 60 volts, substantially greater than zero volts.

7 Claims, 1 Drawing Sheet

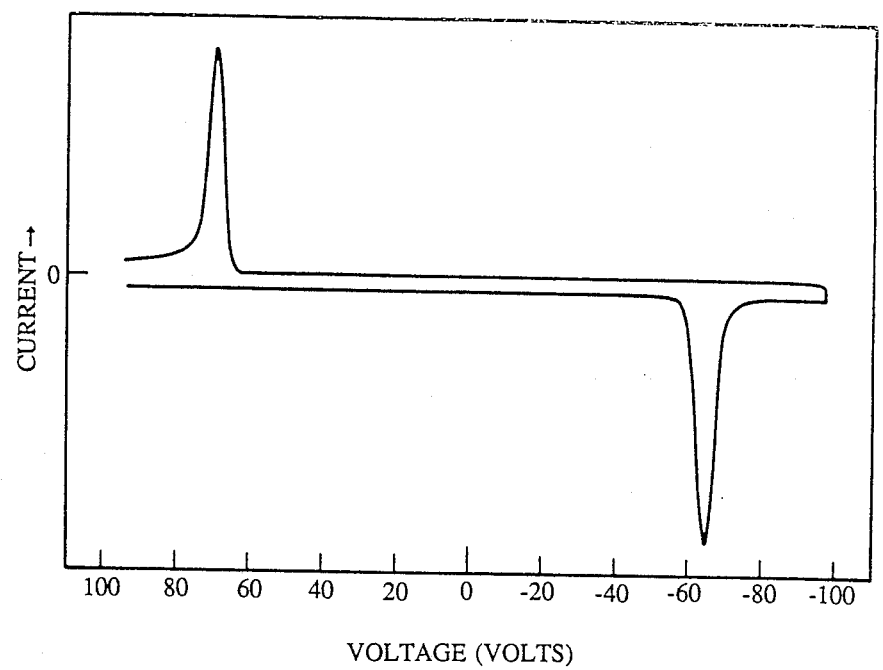

METHOD OF MEASURING MOBILE ION CONCENTRATION IN SEMICONDUCTOR DEVICES

TECHNICAL FIELD

This invention relates generally to a method of measuring, during a semiconductor device fabrication process, mobile ion concentrations in dielectric layers formed as a part of such semiconductor devices.

BACKGROUND OF THE INVENTION

Semiconductor devices typically require materials that are relatively free of contaminants. There are many possible contaminants, and mobile ions, such as sodium ions, are known to be a common contaminant in the dielectrics used in semiconductor device fabrication. For example, such contaminants may be present in the silicon oxide commonly used as a gate oxide in silicon field effect transistors. Such oxides are typically grown by thermal oxidation of the underlying silicon and are generally very thin, for example, less than 100 nm. Mobile ions are known to be undesirable in gate oxides because they tend to cause shifts in device operating voltages. Accordingly, methods have been developed to measure mobile ion concentrations in such oxides.

The conventional method of measuring mobile ion concentration in an oxide layer typically includes periodically varying the voltage, i.e., "sweeping" the voltage, applied to electrodes on opposing sides of the oxide layer and measuring the displacement current that passes through the oxide. Such current typically rises suddenly near zero volts, typically within a few tens of millivolts, and is not typically dependent on the oxide thickness. It is generally believed by workers in the art that such current-versus-voltage behavior arises as weak bonds which have held the mobile ions near the electrode/oxide interface are broken. As a result, a voltage sweep between only very small voltage limits, typically ±5 volts or less, produces an observable peak displacement current very close to zero volts. Higher voltages have not been thought to be needed for oxides and in many prior situations would not be practical because dielectric breakdown might occur for the very thin thermal oxides.

The above described method is generally referred to as the Triangular Voltage Sweep ("TVS") method, and is described, for example, in a paper entitled "The Application of Triangular Voltage Sweep Method To Mobile Charge Studies In MOS Structure," *J. Electrochem. Soc.*, Vol. 118, No. 4, April, 1971, pp. 601-609.

As is well known, dielectrics other than relatively thin, thermally grown oxides are also now commonly used. For example, relatively thick oxides deposited by low temperature chemical vapor deposition techniques are commonly used in semiconductor device fabrication as interlevel dielectrics between two levels of interconnecting metal patterns. Such deposited oxides also are susceptible to mobile ion contamination, which can adversely affect device characteristics as it does for thermally grown gate oxides. However, measurement of the mobile ion concentration in deposited oxides has been more difficult than has the corresponding measurement for thermal oxides.

Difficulties arise for several reasons including the thickness of the deposited oxides, e.g., typically substantially greater than 100 nm, the low temperature heat treatment the deposited oxide generally encounters, and the disordered nature of the dielectric. The deposited oxides are generally less dense than are the thermal oxides and may be considered more disordered than the thermal oxides. The term "disorder" may seem somewhat misdescriptive as applied to an amorphous material such as a glass; however, it is believed that the deposited oxides have more dangling chemical bonds than do the thermal oxides. For this reason, they typically are considered to be more disordered.

Prior attempts to measure mobile ion contamination in thick deposited oxides, using the conventional TVS method have been unsuccessful, i.e., have resulted in no displacement current peaks in the normal ±5 volts range, even with oxide layers which were later found to have significantly deleterious amounts of mobile ion contamination.

SUMMARY OF THE INVENTION

It has been discovered that mobile ion concentrations can be measured reliably in a relatively thick deposited oxide by heating a body including such an oxide to an elevated temperature typically greater than about 250° C.; applying sweep voltages of magnitude greater than normally used heretofore with the TVS method; and observing displacement currents at voltages substantially displaced from zero volts.

BRIEF DESCRIPTION OF THE DRAWING

The FIGURE is a current versus voltage curve obtained for a thick dielectric in accordance with an illustrative embodiment of this invention.

DETAILED DESCRIPTION

The invention will be described by reference to an illustrative embodiment as applied to an unannealed thick dielectric layer comprising PETEOS, a material which typically is employed as an interlevel dielectic, and which, as is known, is produced by a plasma enhanced TEOS deposition process.

The capacitor structure used for measuring the mobile ion concentration had a metal insulator-metal (MIM) structure with aluminum electrodes and an insulator, i.e., dielectric, layer, e.g., the PETEOS dielectric, which was nominally 800 nm thick.

A typical current versus voltage plot in accordance with the illustrative embodiment, for a structure containing a relatively high concentration of mobile sodium ($Na+$) ions, is depicted in the FIGURE. In the FIGURE, the voltage is plotted horizontally and displacement current is plotted vertically. As can be seen in the FIGURE the voltage is plotted in volts (between zero and ±100 volts) and current is plotted in arbitrary units. In practice, however, the displacement current peaks observed were in a range between two and three nanoAmperes ($10^{-9}$ Amperes). To obtain the parameters represented in the FIGURE, a body including the MIM structure was maintained at a temperature of 290° C.

As is evident, the displacement current peaks, representing momentary flow of mobile sodium ions, are significantly displaced from zero volts, e.g., at greater than about 60 volts, and are relatively broad, as compared to the peaks commonly observed for gate oxides. If the bias, e.g., −5 volts d.c., normally used with the TVS method keeps the mobile ions at one of the MIM capacitor plates between voltage sweeps, the traces are essentially exactly reproducible.

However, it has been observed that the peaks in current are pushed significantly further out, i.e., away from zero voltage, if the measurement temperature is lowered from the 290° C. used for the measurements described hereinabove. Accordingly, temperatures of at least 250° C. are preferred. It is theorized that the elevated temperature imparts thermal energy to the mobile ions and helps break the bonds.

In another illustrative embodiment, MOS capacitor structures using PETEOS insulator layers of differing thicknesses, e.g., 800 and 400 nm thick, on a 15 nm square pad, produced similar results. However, the peaks were not as severely displaced as they were for the MIM structure, and there appeared to be a weak connection between the peak push out, that is, the displacement current, and the dielectric thickness. Thus, the magnitude of the electric field appears important. Also, the peak representing the migration of mobile ions from the aluminum PETEOS interface of the MIM structure was lower and broader, as well as more displaced, than the peak created by migration of the mobile ions from the silicon-PETEOS interface of the MOS capacitor structures.

It is hypothesized that the above-described experimental data can be explained by the following. Weak trapping of mobile ions at metal-oxide or silicon-oxide interfaces causes the familiar and commonly observed slight shift from zero volts for thermal oxides. The large shift from zero volts for deposited oxides is thus unexpected and indicates that the mechanisms in the two types of oxides are different.

It is herein theorized that the shape and position of the mobile ion displacement current peaks in the deposited oxides are determined by the film quality. This is plausible because broken bonds of polar sites throughout the glass tend to bind the mobile ions species and thus lessen its mobility. Peak asymmetries which arise from the asymmetric electrodes are likely obscured by the greater effect that the quality of the dielectric has on mobility. Oxide quality is very sensitive to deposition parameters, as is well known to those skilled in the art, and TVS behavior may be quite erratic. The energy required to drive mobile ions out of traps within the film depends on glass quality, and poorer films will trap mobile ions more effectively, due to the greater dangling bond density, and thus require higher electric fields to dislodge the ions.

High voltages and temperatures may be needed to get a mobile ion peak within the desired voltage range. This is especially true with contaminated dielectric layers greater than one micrometer in thickness. However, any current-voltage plot must be interpreted carefully, and the absence of a peak may mean only that either the temperature or voltage was not high enough to move the mobile ions across the dielectric layer.

Although the invention has been described in part by making detailed reference to a certain specific embodiment, such detail is intended to be and will be understood to be instructive rather than restrictive. It will be appreciated by those in the art that many variations may be made in the structure and mode of operation without departing from the spirit and scope of the invention as disclosed in the teachings contained herein. For example, it should be apparent that the invention is not limited to use with technologies employing PETEOS or other TEOS dielectrics. Rather, the invention is believed to be applicable to other disordered dielectrics.

We claim:

1. A method including the steps of fabricating a semiconductor device with a dielectric layer and identifying mobile ion contamination in said dielectric layer which is a part of the body of said device, characterized in the steps of:

heating said device;

applying across said dielectric a sweep voltage of maximum magnitude greater than 5 volts; and observing to detect a peak current at a voltage having a magnitude greater than 5 volts.

2. A method as recited in claim 1 wherein the maximum magnitude of the sweep voltage is greater than about 60 volts.

3. A method as recited in claim 2 wherein the maximum magnitude of the sweep voltage is about 100 volts.

4. A method as recited in claim 1 wherein the temperature is greater than about 250° C.

5. A method as recited in claim 1 in which said mobile ion concentration is measured in an oxide.

6. A method as recited in claim 5 in which said oxide is a deposited oxide.

7. A method as recited in claim 6 in which said deposited oxide has a thickness greater than 100 nm.

* * * * *